(12) United States Patent
Roth et al.

(10) Patent No.: US 12,218,671 B2
(45) Date of Patent: Feb. 4, 2025

(54) PHASE COHERENT SYNTHESIZER

(71) Applicant: Rohde & Schwarz GmbH & Co. KG, Munich (DE)

(72) Inventors: Alexander Roth, Munich (DE); Juergen Rademacher, Munich (DE); Ernst Polz, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/184,292

(22) Filed: Feb. 24, 2021

(65) Prior Publication Data

US 2022/0271743 A1 Aug. 25, 2022

(51) Int. Cl.
*H03K 5/00* (2006.01)
*H03D 7/00* (2006.01)

(52) U.S. Cl.
CPC ........... *H03K 5/00006* (2013.01); *H03D 7/00* (2013.01); *H03K 2005/00286* (2013.01)

(58) Field of Classification Search
CPC .. H03K 2005/00286; H03D 7/00; H03D 7/16; H03D 7/165; H03L 7/23
See application file for complete search history.

(56) References Cited

U.S. PATENT DOCUMENTS 5,399,984 A 3/1995 Frank
6,066,967 A 5/2000 Cahill et al.
(Continued)

FOREIGN PATENT DOCUMENTS

FR 2936621 A1 4/2010

OTHER PUBLICATIONS

Murphy et al. (https://www.analog.com/en/analog-dialogue/articles/all-about-direct-digital-synthesis.html.) (Year: 2004).*

(Continued)

*Primary Examiner* — Patrick C Chen
(74) *Attorney, Agent, or Firm* — CHRISTENSEN O'CONNOR JOHNSON KINDNESS PLLC

(57) ABSTRACT

A phase coherent synthesizer with good phase noise and spurious performance is described. The phase coherent synthesizer includes digital direct synthesizer (DDS) circuitry, frequency multiplier circuitry, an oscillator, and a mixing stage. The digital direct synthesizer (DDS) circuitry has a first output and a second output. The first output is associated with a fine resolution synthesis. The second output is associated with a step synthesis. A second output signal provided via the second output has a higher frequency compared with a first output signal provided via the first output. The frequency multiplier circuitry is connected with the second output. The frequency multiplier circuitry is configured to multiply the second output signal received via the second output, thereby generating a multiplied output signal. The mixing stage has two input ports connected with the frequency multiplier circuitry and the oscillator respectively. The mixing stage includes, for example, circuitry configured to mix the multiplied output signal and an oscillator output signal of the oscillator, thereby generating an intermediate frequency signal. The first output signal and the intermediate frequency signal are synchronized with each other.

16 Claims, 1 Drawing Sheet

(56) References Cited

U.S. PATENT DOCUMENTS

| | | | |
|---|---|---|---|
| 8,115,519 | B2 | 2/2012 | Turner |
| 9,628,066 | B1* | 4/2017 | Chenakin ................ H03L 7/185 |
| 2008/0174925 | A1* | 7/2008 | Woo ........................ H03D 1/22 |
| | | | 361/56 |
| 2008/0284525 | A1 | 11/2008 | Williams |
| 2009/0289730 | A1* | 11/2009 | Kawamura .......... H03D 13/003 |
| | | | 331/1 A |
| 2014/0015572 | A1 | 1/2014 | Nicholls et al. |
| 2014/0021986 | A1 | 1/2014 | Scott et al. |
| 2017/0097405 | A1* | 4/2017 | Lerner .................. G01S 13/583 |
| 2019/0165739 | A1* | 5/2019 | Lyalin ..................... H04B 1/40 |

OTHER PUBLICATIONS

Analog Devices (Data Sheet AD 9958, https://www.analog.com/media/en/technical-documentation/data-sheets/ad9958.pdf ; Revisions 2016) (Year: 2016).*

Chen, Z., et al., "A Multi-channel Phase-coherent X-Band Frequency Synthesizer for Array Radar Applications," Proceedings of 2017 Asia Pacific Microwave Conference, 2017, IEEE, pp. 452-455.

Analog Devices—2-Channel, 500 MSPS DDS with 10-Bit DACs—AD9958 Data Sheet; Sep. 2005; pp. 1-44 <www.analog.com>.

\* cited by examiner

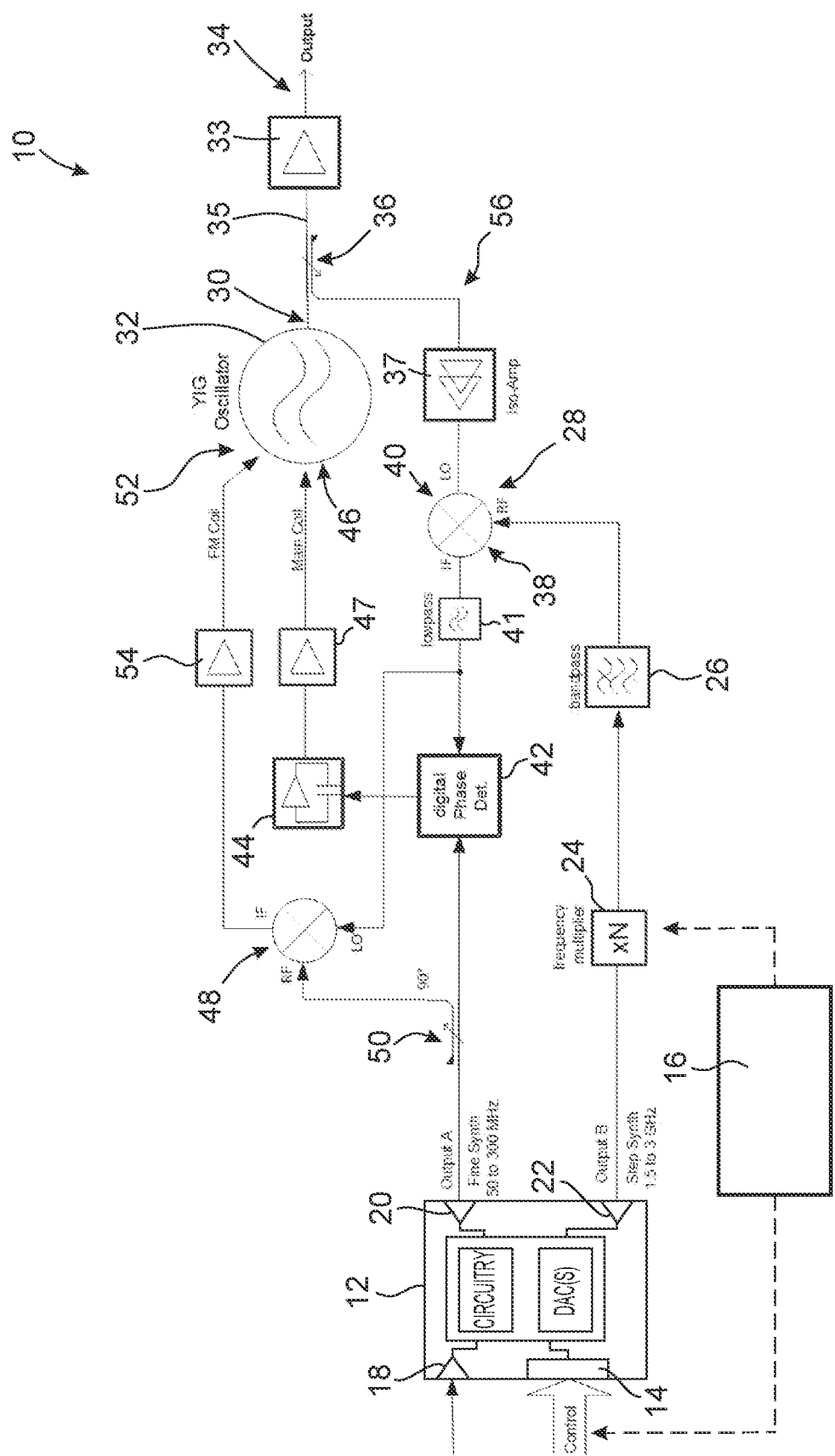

PHASE COHERENT SYNTHESIZER

FIELD OF THE DISCLOSURE

The present disclosure relates to a phase coherent synthesizer with good phase noise and spurious performance.

BACKGROUND

In the state of the art, synthesizers like direct digital synthesizers (DDS) are known that are used to create arbitrary waveforms from a single, fixed-frequency signal, e.g. a reference signal. The direct digital synthesizers are used to generate signals with known and fix phase relation to the reference signal. Therefore, direct digital synthesizers may be used in different applications, for instance in signal generators or as local oscillators.

The direct digital synthesizers typically comprise a frequency reference, a numerically controlled oscillator (NCO) and a digital-to-analog converter (DAC). Due to the imperfectness of the digital-to-analog converter within the direct digital synthesizer crossing spurs appear in dependency of the output frequency. In other words, such a direct digital synthesizer has worse spur/phase noise performance The crossing spurs result from high order (>1) Nyquist images. In addition, a higher noise floor at large frequency offsets occurs due mainly to the digital-to-analog converter. Further, spurious responses occur mainly due to truncation effects in the numerically controlled oscillator.

In the state of the art, synthesizers with better spur/phase noise performance are also known, which however do not ensure phase coherence. Therefore, it is necessary to measure and adjust the respective phase after each change in frequency of the synthesizer, which results in a much slower frequency tuning due to the additional phase calibration steps.

Accordingly, there is need for a synthesizer that provides high performance in terms of spur suppression/phase noise as well as high tuning speed with best performance.

SUMMARY

Embodiments of the present disclosure relate to a phase coherent synthesizer with good phase noise and spurious performance. In an embodiment, the phase coherent synthesizer comprises a digital direct synthesizer (DDS) module composed of or including, for example, one or more circuits. The phase coherent synthesizer also includes a frequency multiplier, an oscillator, and a mixing stage. The digital direct synthesizer (DDS) module has a first output and a second output. The first output is associated with a fine resolution synthesis. The second output is associated with a step synthesis. A second output signal provided via the second output has a higher frequency compared with a first output signal provided via the first output. The frequency multiplier is connected with the second output. The frequency multiplier is configured to multiply the second output signal received via the second output, thereby generating a multiplied output signal. The mixing stage has two input ports connected with the frequency multiplier and the oscillator respectively. The mixing stage is configured to mix the multiplied output signal and an oscillator output signal of the oscillator, thereby generating an intermediate frequency (IF) signal. The first output signal and the intermediate frequency signal are synchronized with each other.

Accordingly, the digital direct synthesizer (DDS) module has two different outputs at which respective output signals are provided. The first output, namely the first output signal provided via the first output, is used for a fine resolution of the oscillator output signal, also called interpolation, whereas the second output, namely the second output signal provided via the second output, is used for a coarse resolution of the oscillator output signal, for example the respective resolution of the frequency of the oscillator output signal. Thus, the first output is associated with a fine resolution synthesizer, whereas the second output is associated with a step/course synthesizer.

The mixing stage down-converts the oscillator output signal into the intermediate frequency when mixing the oscillator output signal with the multiplied output signal. In other words, the multiplied output signal is used to convert the oscillator output signal down to a lower frequency, namely the intermediate frequency, thereby obtaining the intermediate frequency signal.

Accordingly, the phase coherent synthesizer provides a phase coherence since both outputs of the DDS module are associated with each other.

The frequency multiplier multiplies the second output signal by a multiplication factor that is an integer, e.g. 1, 2, 3 and so on.

In general, the DDS module is the best way to generate signals with known and fixed phase relation. In an embodiment, the DDS module typically comprises at least one digital-to-analog converter (DAC).

The phase coherent synthesizer may be used in a signal generator, wherein the oscillator output signal corresponds to the respective output signal of the signal generator. Alternatively, the phase coherent synthesizer may be used in a spectrum analyzer, wherein the oscillator output signal corresponds to a local oscillatory signal that is used for converting an input signal.

An aspect provides that the phase coherent synthesizer comprises a phase detector module composed of or including, for example, one or more circuits. The phase detector module is used to synchronize the first output signal and the intermediate frequency signal with each other.

Another aspect provides that the phase detector module is connected with the first output and the mixing stage. The phase detector module receives the first output signal and the intermediate frequency signal. Hence, the phase detector module receives both signals to be synchronized, thereby gathering information from both signals or rather an information being indicative of a relation between both signals.

The phase detector module is directly connected with the first output. In addition, the phase detector module is indirectly connected with the second output via the mixing stage that receives the multiplied output signal derived from the second output signal.

A further aspect provides that the phase detector module is configured to provide an output signal indicative of a phase difference between the first output signal and the intermediate frequency signal. The output signal indicative of the phase difference is used to synchronize both signal with each other accordingly.

Another aspect provides that the first output and the second output are independent of each other, but phase stable with respect to each other. Therefore, it is ensured that both outputs of the DDS module provide phase coherent output signals.

Another aspect provides that the digital direct synthesizer (DDS) module is configured to provide the second output signal with only discrete frequencies.

Accordingly, it is possible to keep the second output signal free of spurs within a certain bandwidth around the respective output frequency, thereby ensuring that the phase coherent synthesizer has good phase noise and spurious performance.

The second output concerns to the main output of the DDS. Due to the discrete setting of the second output, spurs of the digital-to-analog converter (DAC) of the DDS module can be avoided or rather shifted in frequency.

Accordingly, the second output of the DDS module is used to generate discrete frequencies in the upper frequency range the digital-to-analog converter (DAC) can handle. In some embodiments, only fix frequencies with sufficient spurious performance are used for the second output signal.

A further aspect provides that the digital direct synthesizer (DDS) module is set such that the first output and the second output signal together control the oscillator output signal with an intended synthesized frequency. Therefore, the oscillator of the phase coherent synthesizer is controlled (indirectly) by the respective output signals. The control signals derived from the respective output signals may be used for generating a direct current (DC) magnetic field.

In some embodiments, the digital direct synthesizer (DDS) module is set such that the second output signal has low spurs, whereas the first output signal is used for fine adjustment of the intended synthesized frequency. The second output signal is multiplied by the frequency multiplier, thereby ensuring that the second output signal dominates the phase noise and spur performance of the phase coherent synthesizer. Since the second output signal is provided with only discrete frequencies, the respective spurious performance is improved accordingly. Further, spurs on the first output signal are suppressed due to the lower frequency. The first output signal is used to accurately set the frequency of the oscillator output signal to the intended synthesized frequency.

The phase detector module may be a digital phase detector. For instance, the digital phase detector comprises at least two flip-flops and a XOR gate. The digital phase detector generates a voltage signal that represents the phase difference between the first output signal and the intermediate frequency signal derived from mixing the oscillator output signal with the multiplied output signal.

A further aspect provides that the phase coherent synthesizer comprises a loop filter that is associated with an output of the phase detector module. The loop filter may comprise an operational amplifier with a feedback circuit with a capacitor. The loop filter may have a low pass functionality.

The phase coherent synthesizer may comprise a phase-locked loop (PLL). By the phase-locked loop, the intermediate frequency signal is synchronized with the first output signal. Hence, the phase-locked loop comprises a feedback line that forwards the oscillator output signal to the mixing stage that down-converts the oscillator output signal by the multiplied output signal. In an embodiment, the phase-locked loop also comprises the phase detector module that receives the intermediate frequency signal from the mixing stage as well as the first output signal in order to identify a phase offset. Further, the phase-locked loop in some embodiments comprises the loop filter.

In some embodiments, the phase-locked loop (PLL) is established in a frequency divider free manner (i.e., without a divider). The second output signal is multiplied by the frequency multiplier, thereby generating the multiplied output signal that is used for down-converting the oscillator output signal in order to generate the intermediate frequency signal. The intermediate frequency signal obtained is compared with the first output signal with regard to phase by the phase detector module. Therefore, no frequency divider is necessary that would impair the performance of the phase coherent synthesizer, for example with regard to phase coherence. Since no frequency divider is provided, the signal remains phase stable with the output signal(s) of the DDS module.

According to an embodiment, the oscillator is established as an yttrium-iron garnet (YIG) oscillator. The YIG oscillator ensures very good phase noise performance The YIG oscillator has a main tuning coil used for coarse frequency adjustment as well as a FM coil used for fine frequency adjustment. Thus, the FM coil is more sensitive than the main coil.

Yttrium-iron garnet (YIG) is a ferrite material that resonates at microwave frequencies when immersed in a DC magnetic field. This resonance is directly proportional to the strength of the applied magnetic field and has very linear tuning over multi-octave microwave frequencies. The DC magnetic field is generated using an electro-magnet, a permanent magnet, or a combination of both. The magnetic field of an electromagnet can be "tuned" using a variable current. This can be done by the main tuning coil and the FM coil.

Hence, tuning of the frequency of the oscillator output signal is effected by a magnetic field, whereby relatively high magnetic field strengths are required. The greater part of this field strength is generated by a main coil, whereas fine tuning is effected with the aid of a smaller air-cored coil (also called an FM coil).

The main coil of the YIG oscillator may be fed by the output voltage of the phase detector module, for example wherein the loop filter is located between the oscillator and the phase detector module.

Alternatively, the oscillator may be established as a voltage controlled oscillator (VCO). The digital phase detector module outputs a voltage signal that is forwarded to the voltage controlled oscillator in order to generate the oscillator output signal. The voltage controlled oscillator is an electronic oscillator whose oscillation frequency is controlled by the voltage signal.

According to further aspect, the phase coherent synthesizer has a second mixing stage that is associated with the first output and the mixing stage, for example the intermediate frequency signal provided by the mixing stage. A hybrid coupler is located between the first output of the DDS module and the second mixing stage such that the second mixing stage receives a phase shifted signal derived from the first output signal. The phase shifted signal is shifted by 90 degrees compared to the first output signal due to the hybrid coupler. The second mixing stage may be associated with another control line of the oscillator, e.g. a fine adjustment control line.

For instance, the FM coil of the YIG oscillator is associated with the second mixing stage. In other words, the FM coil of the YIG oscillator is fed by the signal outputted by the second mixing stage, e.g. an output voltage of the second mixing stage.

In some embodiments, the second mixing stage is established as an analog phase detector configured to provide an output signal indicative of a phase difference between the phase shifted signal and the intermediate frequency signal. Therefore, the phase noise performance of the overall phase coherent synthesizer is improved appropriately.

Another aspect provides that the digital direct synthesizer (DDS) module has a control interface and/or an input. The control interface may interact with a processing module or circuit via which the DDS module receives respective control signals that are used to generate the first output signal and the second output signal. The processing module may also control the frequency multiplier in order to set a certain multiplication factor.

Moreover, an input signal can be forwarded to the DDS module via the input, which is processed by the DDS module in order to generate the output signal(s).

The phase coherent synthesizer may have a main output that is associated with the oscillator. The main output may be associated with an output of a device that comprises the phase coherent synthesizer, for instance a signal generator.

In some embodiments, a coupler is located between the oscillator and the main output. The coupler provides the oscillator output signal of the oscillator that is forwarded to the mixing stage. The phase-locked loop (PLL) comprises the coupler located in the output path of the phase coherent synthesizer such that the oscillator output signal is forwarded to the mixing stage accordingly.

Generally, the phase detection is done by a combination of frequency selective digital phase detector, namely the phase detector module, and an analog mixer, namely the second mixing stage.

Accordingly, the digital phase detector, namely the phase detector module, is used to coarsely tune the oscillator, e.g. the YIG oscillator or the voltage controlled oscillator (VCO), to the right frequency. The analog mixer, namely the second mixing stage, having better phase noise performance is used to lock the oscillator, for example the YIG oscillator via the much faster FM coil.

The phase shift between the analog phase detection, namely the analog mixing stage, and the digital phase detection, namely the phase detector module, is compensated by the phase shift introduced by the hybrid coupler.

In addition, an optional dithering may be performed in order to further suppress any spurs in the first output signal. The optional dithering may be done by a dither loop.

In general, the phase coherent synthesizer, for example the DDS module, has the first output for fine adjustment and the second output for reducing the spurs.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

the FIGURE is an overview of a phase coherent synthesizer according to one or more aspects of the present disclosure is schematically shown.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In some embodiments described below, the term "module," "unit" or "stage," etc., refers to or includes, inter alia, a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

The FIGURE shows an example of a phase coherent synthesizer 10 that has good phase noise and spurious performance The phase coherent synthesizer 10 comprises a digital direct synthesizer (DDS) module 12 that has a control interface 14 via which control signals from a separately formed processing module 16 are received. Of course, the digital direct synthesizer (DDS) module 12 and the processing module 16 may include circuitry for carrying out their respective functions.

The DDS module 12 also comprises an input 18 via which a signal is received, e.g. a reference signal, which is processed internally by the DDS module 12 in order generate analog output signals. Moreover, digital instructions may be received that are processed by the DDS module 12 in order to generate the output signals. For this purpose, the DDS module 12 comprises at least one internal digital-to-analog converter in an integrated manner, for example two digital-to-analog converters.

The DDS module 12 has a first output 20 as well as a second output 22 that are independent of each other, but phase stable with respect to each other. Hence, the output signals provided at the respective outputs 20, 22, namely the first output signal and the second output signal, are phase coherent with respect to each other.

In the shown embodiment, the second output 22 is associated with a step synthesis, e.g. a step/coarse synthesis provided by the phase coherent synthesizer 10. In some embodiments, a second output signal provided via the second output 22 is associated with a frequency range from, for example, 1.5 to 3 GHz.

In contrast, the first output 20 is associated with a fine resolution synthesis, also called interpolation synthesis, e.g. a fine synthesis provided by the phase coherent synthesizer 10. A first output signal provided via the first output 20 is associated with a frequency range from, for example, 50 to 300 MHz. Accordingly, the second output signal has a higher frequency compared to the first output signal.

Put differently, the second output signal is used for setting the synthesized frequency of the phase coherent synthesizer 10 in a coarse manner, whereas the first output signal is used for setting accurate steps between, for example, 50 and 300 MHz. Accordingly, the second output signal is used for a coarse setting, whereas the first output signal is used for fine setting.

Generally, the second output signal only has discrete frequencies, thereby ensuring spurious free signals or rather low phase noise.

In addition, the phase coherent synthesizer 10 comprises a frequency multiplier 24 that is associated with the second output 22 such that the second output signal is multiplied with regard to its frequency, thereby generating a multiplied output signal that is processed by an optional band-pass filter 26 subsequently.

The multiplied output signal, for example the band-pass filtered one, is forwarded to a mixing stage 28 that is also associated with an output 30 of an oscillator 32 of the phase coherent synthesizer 10. In the shown embodiment, the oscillator 32 is established by an Yttrium-Iron Garnet (YIG) oscillator.

The oscillator 32 is inter alia controlled by tuning signals or rather control signals, which are derived from the output signals provided at the outputs 20, 22, thereby generating a magnetic field, e.g. a direct current (DC) magnetic field. The magnetic field is used for setting the oscillator 32 with regard to its resonance properties such that the frequency of the oscillator output signal is set. In some embodiments, the output signals are used to obtain an intended synthesized frequency of the oscillator output signal.

The oscillator 32 outputs the oscillator output signal with a respective frequency via an amplifier 33 towards a main output 34. The oscillator output signal provided at the main output 34 may be used in different technical areas depending on the application of the phase coherent synthesizer 10 itself.

For instance, the phase coherent synthesizer 10 is associated with a signal generator such that the oscillator output signal provided at the main output 34 corresponds to the generated output signal of the signal generator. Alternatively, the phase coherent synthesizer 10 is associated with a signal analyzer, wherein the oscillator output signal is used as an internal local oscillator signal.

In an output line 35 provided between the oscillator 32, for example its output 30, and the main output 34, a coupler 36 is provided. The coupler 36 is used for providing the oscillator output signal, which is forwarded to the mixing stage 28. Previously, the oscillator output signal obtained via the coupler 36 is amplified by an isolated amplifier 37. Accordingly, the mixing stage 28 has two input ports 38, 40 via which the multiplied output signal and the oscillator output signal from the oscillator 32 are received respectively.

The mixing stage 28 down-converts the oscillator output signal by the multiplied output signal to a (low) intermediate frequency signal (IF signal). Thus, the mixing stage 28 generates the IF signal that is used for further processing. The IF signal is filtered by a low-pass filter 41 associated with an output of the mixing stage 28.

Generally, the intermediate frequency signal provided by the mixing stage 28 and the first output signal provided by the first output 20 are synchronized with each other as will be explained in more detail hereinafter.

The phase coherent synthesizer 10 further comprises a phase detector module 42, for example a digital phase detector. The phase detector module 42 may include circuitry for carrying out its respective function(s).

The phase detector module 42 is associated with the first output 20 and the mixing stage 28 such that the respective signals received, namely the first output signal from the first output 20 as well as the intermediate frequency signal from the mixing stage 28, are compared with each other with respect to their phase. Accordingly, a phase difference may be detected by the phase detector module 42.

The phase detector module 42 outputs, depending on the phase difference detected, a voltage signal, namely a direct voltage signal. The direct voltage signal outputted by the phase detector module 42 is forwarded to a loop filter 44 that processes the respective voltage signal that is used for controlling a main coil 46 of the oscillator 32. Previously, the respective voltage signal processed by the loop filter 44 is amplifier by an amplifier 47. In the shown embodiment, the phase detector module 42 is a digital phase detector.

In some embodiments, the phase coherent synthesizer 10 comprises a second mixing stage 48 that is associated with the first output 20 and the mixing stage 28, namely the first mixing stage 28. The second mixing stage 48 is established as, for example, an analog phase detector that provides an output signal indicative of the phase difference between the signals received, namely the IF signal and a signal derived from the first output signal.

The signal derived from the first output signal is obtained via a hybrid coupler 50 that is located between the first output 20 and the second mixing stage 48.

Hence, the second mixing stage 48 receives a phase shifted signal that is derived from the first output signal. The phase shifted signal is phase-shifted by 90° with respect to the first output signal.

Depending on the phase difference detected by the analog phase detector, namely the second mixing stage 48, between the IF signal provided by the mixing stage 28 and the phase shifted signal derived from the first output signal, the second mixing stage 48 outputs a voltage signal that is used for controlling the oscillator 32. In the shown embodiment, a FM coil 52 of the YIG oscillator is controlled by the voltage signal of the second mixing stage 48, namely the analog phase detector. Previously, the voltage signal of the second mixing stage 48 is amplified by an amplifier 54.

Accordingly, the phase coherent synthesizer 10 comprises a phase-locked loop 56 that comprises the analog phase detector, namely the second mixing stage 48, as well as the digital phase detector, namely the phase detector module 42.

The respective phase shift between the analog phase detector and the digital phase detector is compensated by the phase shift introduced due to the hybrid coupler 50.

Alternatively, the oscillator 42 may be established as a voltage controlled oscillator that receives the respective voltage signals from the different phase detectors 42, 48 for controlling the oscillator output signal.

Furthermore, the phase-locked loop 26, which is established in a frequency divided free manner due to the frequency multiplier 24, ensures phase coherence of the signals used for controlling the oscillator 32, for example the main coil 46 and the FM coil 52.

In some embodiments, the digital direct synthesizer (DDS) module 12 is set such that the first output signal and the second output signal together control the oscillator 32 to generate the oscillator output signal with an intended synthesized frequency. In some embodiments, the digital direct synthesizer (DDS) module 12 is set such that the second output signal has low spurs, whereas the first output signal is used for fine adjustment of the intended synthesized frequency.

Generally, it is ensured, e.g. by the phase-locked loop 56 and the associated components, that the first output signal and the intermediate frequency signal are synchronized with each other. Therefore, the phase coherent synthesizer 10 has a good phase noise and spurious performance while ensuring high tuning speed simultaneously.

Certain embodiments disclosed herein, for example the respective module(s), stage(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the components described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A synthesizer comprising:
    an oscillator configured to output an oscillator output signal;
    a coarse frequency adjustment circuit for the oscillator and a fine adjustment circuit for the oscillator;
    a frequency multiplier for receiving a first analog signal, wherein the frequency multiplier is configured to multiply the first analog signal for generating a multiplied output signal;
    a first mixing stage having two input ports connected with the frequency multiplier and the oscillator, respectively, the first mixing stage being configured to mix the multiplied output signal and an oscillator output signal of the oscillator, thereby generating an intermediate frequency signal;
    a phase detector circuit configured to receive the intermediate frequency signal and a second analog signal, wherein the phase detector circuit is further configured to output a first control signal indicative of a phase difference between the second analog signal and the intermediate frequency signal; and
    a second mixing stage configured to receive the second analog signal and the intermediate frequency signal, and configured to output a second control signal indicative of a phase difference between the second analog signal and the intermediate frequency signal;
    wherein the coarse frequency adjustment circuit and a fine frequency adjustment circuit are controlled by the first control signal and second control signal, respectively, for generating the oscillator output signal of the oscillator.

2. The synthesizer according to claim 1, wherein the first analog signal and the second analog signal are independent of each other, but phase stable with respect to each other.

3. The synthesizer according to claim 1, wherein the first analog signal has low spurs, whereas the second analog signal is used for fine adjustment of the intended synthesized frequency.

4. The synthesizer according to claim 1, wherein the phase detector circuit includes a digital phase detector.

5. The synthesizer according to claim 1, wherein the synthesizer comprises a loop filter that is associated with an output of the phase detector circuit.

6. The synthesizer according to claim 1, wherein the synthesizer comprises a phase-locked loop (PLL).

7. The synthesizer according to claim 6, wherein the phase-locked loop (PLL) is established in a frequency divider free manner.

8. The synthesizer according to claim 1, wherein the oscillator includes an yttrium-iron garnet (YIG) oscillator.

9. The synthesizer according to claim 1, wherein the oscillator includes a voltage controlled oscillator (VCO).

10. The phase coherent synthesizer according to claim 1, wherein a hybrid coupler is connected with the second mixing stage such that the second mixing stage receives a phase shifted signal derived from the second analog signal.

11. The synthesizer according to claim 1, wherein the second mixing stage includes an analog phase detector configured to provide an output signal indicative of a phase difference between the phase shifted signal and the intermediate frequency signal.

12. The synthesizer according to claim 1, further including at least one of a control interface and an input.

13. The synthesizer according to claim 1, further comprising a main output that is associated with the oscillator.

14. The synthesizer according to claim 13, wherein a coupler is provided that is located between the oscillator and the main output, the coupler providing the oscillator output signal of the oscillator that is forwarded to the first mixing stage.

15. The synthesizer according to claim 1, wherein the first analog signal and the second analog signal together control the oscillator to generate the oscillator output signal with an intended synthesized frequency.

16. A synthesizer, comprising:
an oscillator configured to output an oscillator output signal, the oscillator including an yttrium-iron garnet (YIG) oscillator;
a coarse frequency adjustment circuit for the oscillator and a fine adjustment circuit for the oscillator;
a frequency multiplier for receiving a first analog signal, wherein the frequency multiplier is configured to multiply the first analog signal for generating a multiplied output signal;
a mixing stage having two input ports connected with the frequency multiplier and the oscillator, respectively, the mixing stage being configured to mix the multiplied output signal and the oscillator output signal of the oscillator, thereby generating an intermediate frequency signal;
a main output connected to the oscillator for receiving the oscillator output signal; and
a coupler located between the oscillator and the main output, wherein the coupler provides the oscillator output signal of the oscillator that is forwarded to the mixing stage,
wherein the coarse frequency adjustment circuit and the fine frequency adjustment circuit are controlled by a first control signal derived from a second analog signal and a second control signal derived from the first analog signal, respectively, for generating the oscillator output signal of the oscillator.

* * * * *